(12) United States Patent  
Zhang et al.

(10) Patent No.: US 11,432,416 B2
(45) Date of Patent: Aug. 30, 2022

(54) ANTI-COLLISION DEVICE FOR LED SCREEN

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhengqiang Li, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/279,579

(22) PCT Filed: Mar. 3, 2021

(86) PCT No.: PCT/CN2021/078873
§ 371 (c)(1),
(2) Date: Mar. 24, 2021

(87) PCT Pub. No.: WO2021/208622
PCT Pub. Date: Oct. 21, 2021

(65) Prior Publication Data
US 2022/0117099 A1 Apr. 14, 2022

(30) Foreign Application Priority Data

Apr. 13, 2020 (CN) .......................... 202010286061.4

(51) Int. Cl.
H05K 7/02 (2006.01)
H05K 7/04 (2006.01)
(Continued)

(52) U.S. Cl.
CPC ......... *H05K 5/0217* (2013.01); *H05K 5/0017* (2013.01); *H05K 5/0021* (2013.01); *G09F 9/33* (2013.01)

(58) Field of Classification Search
USPC ........................................ 361/807, 809, 810
See application file for complete search history.

(56) References Cited

U.S. PATENT DOCUMENTS

2007/0000849 A1* 1/2007 Lutz .......................... G09F 9/33
  211/26
2015/0276120 A1* 10/2015 Shibata ................ F16M 11/045
  361/679.01
(Continued)

FOREIGN PATENT DOCUMENTS

CN 106128322 A 11/2016
CN 106683583 A 5/2017
(Continued)

OTHER PUBLICATIONS

Supplementary European Search Report of counterpart European Patent Application No. 21718485.2 dated Apr. 4, 2022.

*Primary Examiner* — Hung S. Bui

(57) ABSTRACT

Provided is an anti-collision device for LED screen, comprising a box body (1), a telescopic rotating mechanism, an anti-collision sheet (4) and a display module (2); the peripheral side of the box body (1) is provided with a mounting hole (12) and a receiving groove (11); the telescopic rotating mechanism is embedded in the mounting hole (12) and movably connected with the box body (1); the anti-collision sheet (4) is fixedly connected with the telescopic rotating mechanism. When the telescopic rotating mechanism is not subjected to external force, the telescopic rotating mechanism enables the anti-collision sheet (4) to shield the peripheral side of the display module (2) outside the receiving groove (11); when the telescopic rotating mechanism is 
(Continued)

subjected to external force, the telescopic rotating mechanism drives the anti-collision sheet (4) to retract and rotate to be embedded in the receiving groove (11).

14 Claims, 7 Drawing Sheets

(51) Int. Cl.
*H05K 5/02* (2006.01)
*H05K 5/00* (2006.01)
*G09F 9/33* (2006.01)

(56) References Cited

U.S. PATENT DOCUMENTS

2016/0231976 A1* 8/2016 Ryu ................ G06F 3/1446
2017/0105293 A1* 4/2017 Kim ................ H05K 5/0221

FOREIGN PATENT DOCUMENTS

| | | |
|---|---|---|
| CN | 106710459 A | 5/2017 |
| CN | 207658378 U | 7/2018 |
| CN | 109767697 A | 5/2019 |
| CN | 209216469 U | 8/2019 |
| CN | 110390892 A | 10/2019 |
| CN | 110706613 A | 1/2020 |
| CN | 110913619 A | 3/2020 |
| JP | 2018072661 A | 5/2018 |

* cited by examiner

ANTI-COLLISION DEVICE FOR LED SCREEN

The present application claims the priority of the Chinese patent application (No. 202010286061.4) filed with China Patent Office on Apr. 13, 2020, titled "Anti-collision device for LED screen", the contents of which are incorporated herein by reference in their entirety.

TECHNICAL FILED

The application relates to the technical field of protection device of display screen, and in particular to an anti-collision device for LED screen.

BACKGROUND

LED display screen is a kind of flat panel display, which is used to display information such as text, image, video and video signal. Because LED display screen can be freely extended and seamlessly spliced, and it can use interactive technology, has long running time and good display effect, it is widely used in airports, shopping malls, hotels, high-speed rails, subways, cinemas, exhibitions, office buildings and other place.

LED display screen comprises a box body and a display module mounted on the box body, wherein the display module comprises a PCB board and lamp beads arranged on the PCB board. In the process of transporting the LED display screen, it is very easy to collide, which may cause the PCB board to be deformed and damaged, or knock off the lamp beads on the PCB board.

In the prior art, before transporting the LED display screen, the transport worker would manually prepare corner protectors at the edges of the display module. When splicing LED display screens, the worker would manually remove the corner protectors from the edges of the display module to avoid the corner protectors affecting the assembly of LED display screens. Therefore, the applicant realized that the existing protection device for display module is very inconvenient to use.

Technical Problems

The present application aims to solve the technical problem that the existing protection device for display module is inconvenient to use, and provides an anti-collision device for LED screen.

Technical Solutions

The application adopts the following technical solutions to solve the above technical problems: an anti-collision device for LED screen is provided, including a box body, a telescopic rotating mechanism, an anti-collision sheet and a display module installed on the box body;

a peripheral side of the box body is provided with a mounting hole and a receiving groove for receiving the anti-collision sheet;

the telescopic rotating mechanism is embedded in the mounting hole and movably connected with the box body;

the anti-collision sheet is fixedly connected with the telescopic rotating mechanism;

when the telescopic rotating mechanism is not subjected to external force in its direction of extension and retraction, the telescopic rotating mechanism automatically enables the anti-collision sheet to shield a peripheral side of the display module outside the receiving groove; and when the telescopic rotating mechanism is subjected to external force in its direction of retracting the box body, the telescopic rotating mechanism automatically drives the anti-collision sheet positioned outside the receiving groove to retract and rotate to be embedded in the receiving groove.

In the anti-collision device for LED screen of the application, the telescopic rotating mechanism includes an elastic mechanism embedded in the mounting hole, and the anti-collision sheet is fixed on the elastic mechanism; and the elastic mechanism can drive the anti-collision sheet to extend out of or retract into the receiving groove.

In the anti-collision device for LED screen of the application, the elastic mechanism includes a guide shaft slidably arranged in the mounting hole and a first elastic component embedded in the mounting hole, and the anti-collision sheet is fixedly connected with the guide shaft; and two ends of the first elastic component are respectively abutted with the guide shaft and a hole wall of the mounting hole.

In the anti-collision device for LED screen of the application, the guide shaft is a shaft sleeve; the telescopic rotating mechanism further includes a positioning shaft, the positioning shaft is embedded in the shaft sleeve and is non-rotatably connected with the hole wall of the mounting hole.

In the anti-collision device for LED screen of the application, an outer side of the positioning shaft or an inner side of the shaft sleeve is provided with a spirally-rising sliding groove with closed ends, and the outer side of the positioning shaft or the inner side of the shaft sleeve is correspondingly provided with a sliding block; and the sliding block is slidably arranged in the sliding groove, and the first elastic component can drive the shaft sleeve to move relative to the positioning shaft.

In the anti-collision device for LED screen of the application, a limit part installed on the box body is further included; and a side face of the positioning shaft is provided with a limit groove, and the limit part extends into the limit groove.

In the anti-collision device for LED screen of the application, a plurality of the telescopic rotating mechanisms are provided, and distributed on opposite sides of the box body.

In the anti-collision device for LED screen of the application, the telescopic rotating mechanism is positioned at one side of the box body, an end of the positioning shaft exposing the anti-collision sheet is provided with a convex part; the telescopic rotating mechanism is positioned at another side of the box body, an end of the positioning shaft exposing the anti-collision sheet is provided with a positioning hole; and when adjacent box bodies are spliced, the convex part of the positioning shaft on one box body extends into the positioning hole of the positioning shaft on another box body.

In the anti-collision device for LED screen of the application, a second elastic component arranged in the mounting hole is further included, and the limit groove extends along axial direction of the positioning shaft;

two ends of the second elastic component are respectively abutted against the positioning shaft and a hole wall the mounting hole.

In the anti-collision device for LED screen of the application, the positioning shaft is provided with a guide hole, and one end of the second elastic component is arranged in the guide hole.

In the anti-collision device for LED screen of the application, the positioning shaft has a first large-diameter section and a first small-diameter section; and the shaft sleeve abuts against an end wall of the first large-diameter section near the first small-diameter section.

In the anti-collision device for LED screen of the application, the guide hole is arranged on the first large-diameter section.

In the anti-collision device for LED screen of the application, the limit groove is arranged on the first large-diameter section.

In the anti-collision device for LED screen of the application, the shaft sleeve has a second large-diameter section and a second small-diameter section; and outer diameter of the second small-diameter section is the same as that of the first large-diameter section; and the first elastic component is sleeved on the second small-diameter section.

In the anti-collision device for LED screen of the application, the anti-collision sheet is fixedly arranged on an end face of the second large-diameter section away from the second small-diameter section.

Beneficial Effects

Compared with the prior art, the anti-collision device for LED screen provided by the present application has the following advantages: a mounting hole is arranged on the box body of the anti-collision device for LED screen, and the telescopic rotating mechanism is embedded in the mounting hole, so that the structure is more compact. The receiving groove and mounting hole are located at the periphery side of the box body, which shortens the response time of the anti-collision sheet and simplifies the structure of the telescopic rotating mechanism. The telescopic rotating mechanism is movably connected with the box body, so as to prevent the telescopic rotating mechanism from separating from the box body, thereby avoiding the inconvenience caused by protection devices for the display module. The anti-collision sheet is fixedly connected with the telescopic rotating mechanism, so that the motion state of the anti-collision sheet is synchronized with the telescopic rotating mechanism, thereby facilitating the telescopic rotating mechanism to drive the anti-collision sheet to protect the display module. When the telescopic rotating mechanism is not subjected to external force in its direction of extension and retraction, the telescopic rotating mechanism can automatically drive the anti-collision sheet to shield the peripheral side of the display module outside the receiving groove, thus protecting the display module and preventing the display module from being damaged. When assembling the box bodies of two LED display screens, the box bodies close to each other will give the telescopic rotating mechanism an external force in the direction of retracting the box body to press the telescopic rotating mechanism towards the mounting hole. The anti-collision sheet is automatically driven to rotate by the telescopic rotating mechanism until the anti-collision sheet retracts into the receiving groove, thereby avoiding the interference of the anti-collision sheet in the assembly process of the LED display screens and reducing the assembly gap between two adjacent LED display screens. When not assembled together, the anti-collision sheet shields the peripheral side of the display module; when assembled together, the anti-collision sheet retracts into the receiving groove. The whole process is simple and convenient without manual operation by users.

BRIEF DESCRIPTION OF DRAWINGS

In order to explain the technical solution in the embodiments of this application, the drawings used in the embodiments or the description of the prior art will be briefly introduced below. Obviously, the drawings in the following description are only some embodiments of this application, and for those skilled in the art, other drawings can be obtained according to these drawings without inventive efforts.

Figure 1:
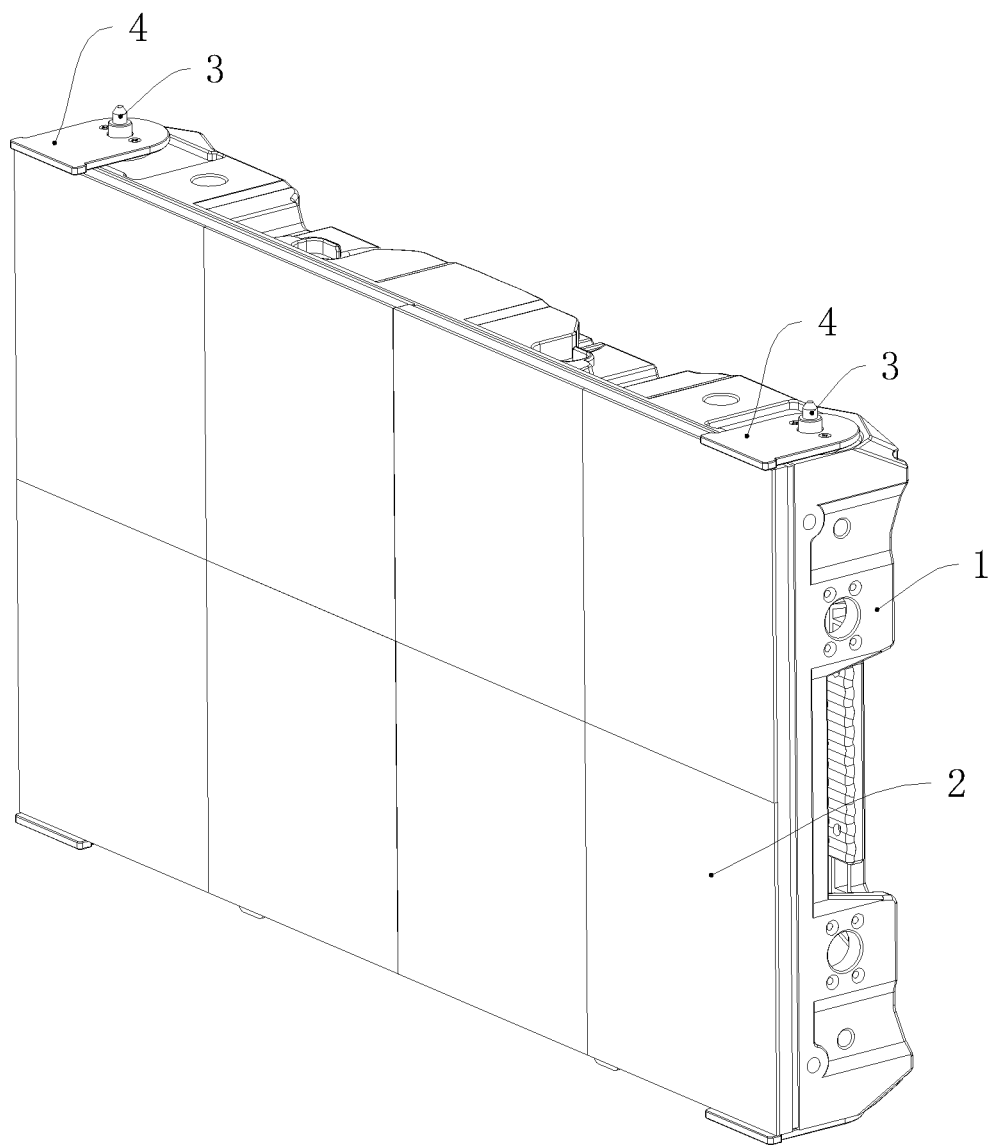
FIG. 1 is a structural schematic diagram I of the anti-collision device for LED screen provided by an embodiment of the present application.
Figure 2:
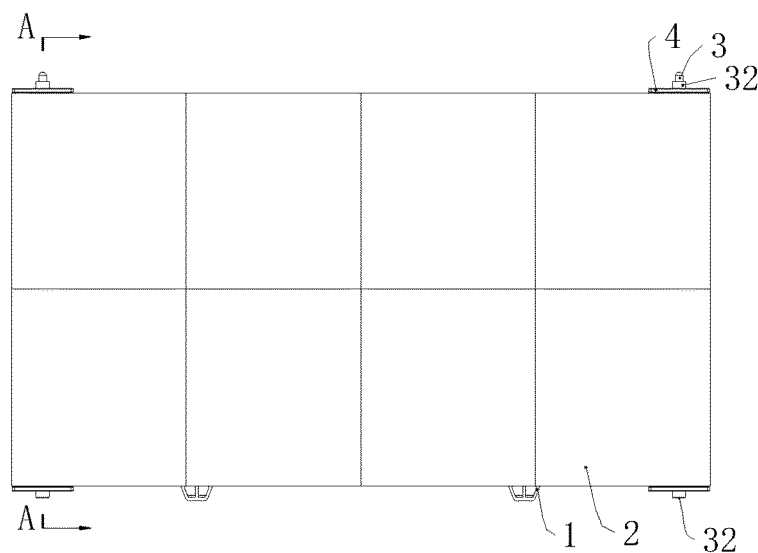
FIG. 2 is a structural schematic diagram II of the anti-collision device for LED screen provided by an embodiment of the present application.

The reference numerals in the figures are as follows:
1. Box body; 11. Receiving groove; 12. Mounting hole;
2. Display module;
3. Telescopic rotating mechanism; 31. Elastic mechanism; 311. Shaft sleeve; 3111. Second large-diameter section; 3112. Second small-diameter section; 3113. Sliding groove; 312. First elastic component; 32. Positioning shaft; 321. First large-diameter section; 3211. Guide hole; 3212, limit groove; 322. First small-diameter section; 3221. Sliding block; 3222. Positioning hole;
4. Anti-collision sheet;
5. Second elastic component;
6. Limit part.

DETAILED DESCRIPTION

In order to make the technical problems solved by this application, technical solutions and beneficial effects clearer, the application will be further described in detail with reference to the drawings and embodiments. It should be understood that the specific embodiments described herein are only used to illustrate the application, and not intended to limit the application.

It should be noted that an element can be directly or indirectly "fixed" or "arranged" on/in another element. An element can be directly or indirectly "connected" to another element.

It should be understood that the terms "length", "width", "upper", "lower", "front", "rear", "left", "right", "vertical", "horizontal", "top", "bottom", "inside" and "outside" indicating the orientation or positional relationship are based on the drawings, which is only for the convenience of describing the application and simplifying the description, but does not indicate or imply that the device or element must have a specific orientation, be constructed or operated in a specific orientation, thus it shall not be understood as limiting the application.

In addition, the terms "first" and "second" are only used for descriptive purposes, and shall not be understood as indicating or implying relative importance or implicitly indicating the number of technical features. Therefore, the features defined with "first" and "second" may include one or more of the features explicitly or implicitly. In the description of this application, "multiple" means two or more, unless otherwise specifically defined. The singular terms "a", "an" and "the" include plural reference and vice versa unless the context clearly indicates otherwise.

Referring to FIG. 1 to FIG. 4, the anti-collision device for LED screen provided by this application is described in details as follows: The anti-collision device for LED display screen includes a box body 1, a telescopic rotating mechanism 3, an anti-collision sheet 4 and a display module 2 installed on the box body 1;

a peripheral side of the box body 1 is provided with a mounting hole 12 and a receiving groove 11 for receiving the anti-collision sheet 4;

the telescopic rotating mechanism 3 is embedded in the mounting hole 12 and movably connected with the box body 1;

the anti-collision sheet 4 is fixedly connected with the telescopic rotating mechanism 3;

when the telescopic rotating mechanism 3 is not subjected to external force in its direction of extension and retraction, the telescopic rotating mechanism 3 automatically enables the anti-collision sheet 4 to shield a peripheral side of the display module 2 outside the receiving groove; and when the telescopic rotating mechanism 3 is subjected to external force in its direction of retracting the box body, the telescopic rotating mechanism 3 automatically drives the anti-collision sheet 4 positioned outside the receiving groove 11 to retract and rotate to be embedded in the receiving groove 11.

When two box bodies 1 are spliced, the telescopic rotating mechanism 3 receives external force in the direction of retracting the box body 1, the anti-collision sheet 4 located outside the receiving groove 11 is automatically driven by the telescopic rotating mechanism 3 to retract and rotate to be embedded in the receiving groove 11. When two spliced box bodies 1 are disassembled, the telescopic rotating mechanism 3 is not subjected to external force in the direction of extension and retraction, the telescopic rotating mechanism 3 automatically drives the anti-collision sheet 4 located in the receiving groove 11 to extend out and rotate to shield the peripheral side of the display module 2 outside the receiving groove 11.

Compared with the prior art, the anti-collision device for LED screen provided by the present application is provided with a mounting hole 12 on the box body 1, and the telescopic rotating mechanism 3 is embedded in the mounting hole 12, so that the structure is more compact. The receiving groove 11 and mounting hole 12 are arranged at the periphery side of the box body 1, which shortens the response time of the anti-collision sheet 4 and simplifies the structure of the telescopic rotating mechanism 3. The telescopic rotating mechanism is movably connected with the box body 1, so as to prevent the telescopic rotating mechanism 3 from separating from the box body 1, thereby avoiding the inconvenience caused by protection devices for the display module 2. The anti-collision sheet 14 is fixedly connected with the telescopic rotating mechanism 3, so that the motion state of the anti-collision sheet 14 is synchronized with the telescopic rotating mechanism 3, thereby facilitating the telescopic rotating mechanism 3 to drive the anti-collision sheet 4 to protect the display module 2. When the telescopic rotating mechanism 3 is not subjected to external force in its direction of extension and retraction, the telescopic rotating mechanism 3 can automatically drive the anti-collision sheet 4 to shield the peripheral side of the display module 2 outside the receiving groove 11, thus protecting the display module 2 and preventing the display module 2 from being damaged. When assembling the box bodies 1 of two LED display screens, the box bodies 1 close to each other will give the telescopic rotating mechanism 3 an external force in the direction of retracting the box body 1 to press the telescopic rotating mechanism 3 towards the mounting hole 12. The anti-collision sheet 4 is automatically driven to rotate by the telescopic rotating mechanism 3 until the anti-collision sheet 4 retracts into the receiving groove 11, thereby avoiding the interference of the anti-collision sheet 4 in the assembly process of the LED display screens and reducing the assembly gap between two adjacent LED display screens. When not assembled together, the anti-collision sheet 4 shields the peripheral side of the display module 2; when assembled together, the anti-collision sheet 4 retracts into the receiving groove 11. The whole process is simple and convenient without manual operation by users.

Particularly, the shape of the anti-collision sheet 4 is designed according to actual requirements.

Figure 4:
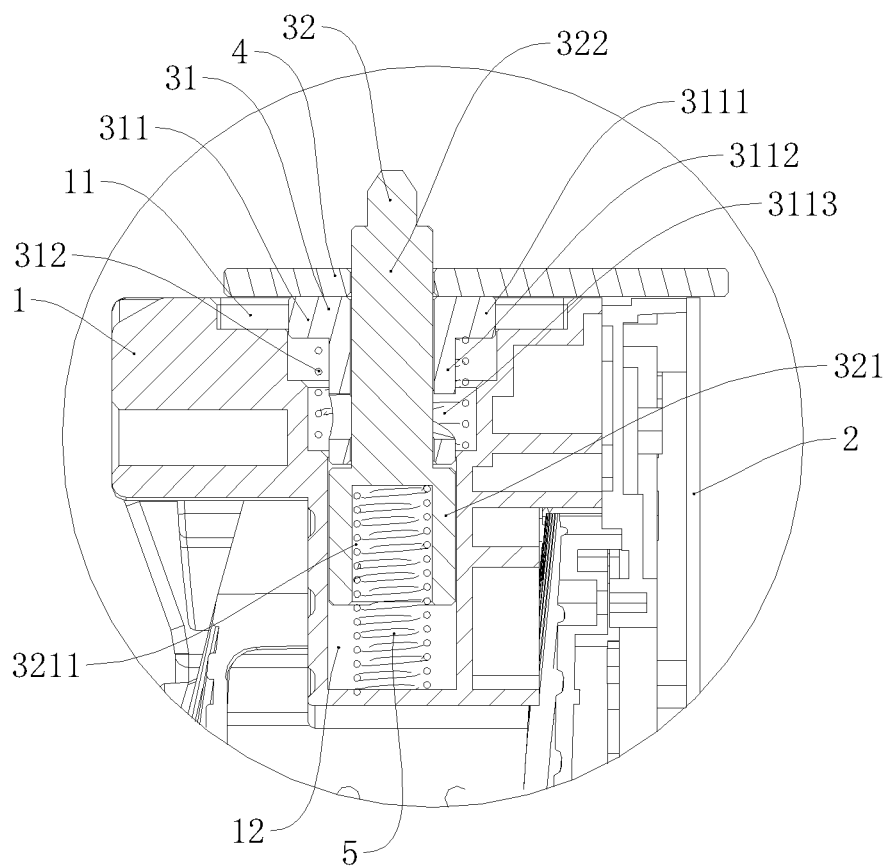
FIG. 4 is an enlarged view of B shown in FIG. 3.

In an embodiment, referring to FIG. 4, the telescopic rotating mechanism 3 includes an elastic mechanism 31 embedded in the mounting hole 12, and the anti-collision sheet 4 is fixedly arranged on the elastic mechanism 31.

The elastic mechanism 31 can drive the anti-collision sheet 4 to extend out of or retract into the receiving groove 11. Compared with the driving mode of automatic control such as motor or air cylinder, the anti-collision sheet 4 of the present application is driven to extend out of or retract into the receiving groove 11 by the mechanical movement of the elastic mechanism 31, which has the advantages of low cost and simple structure.

Figure 6:
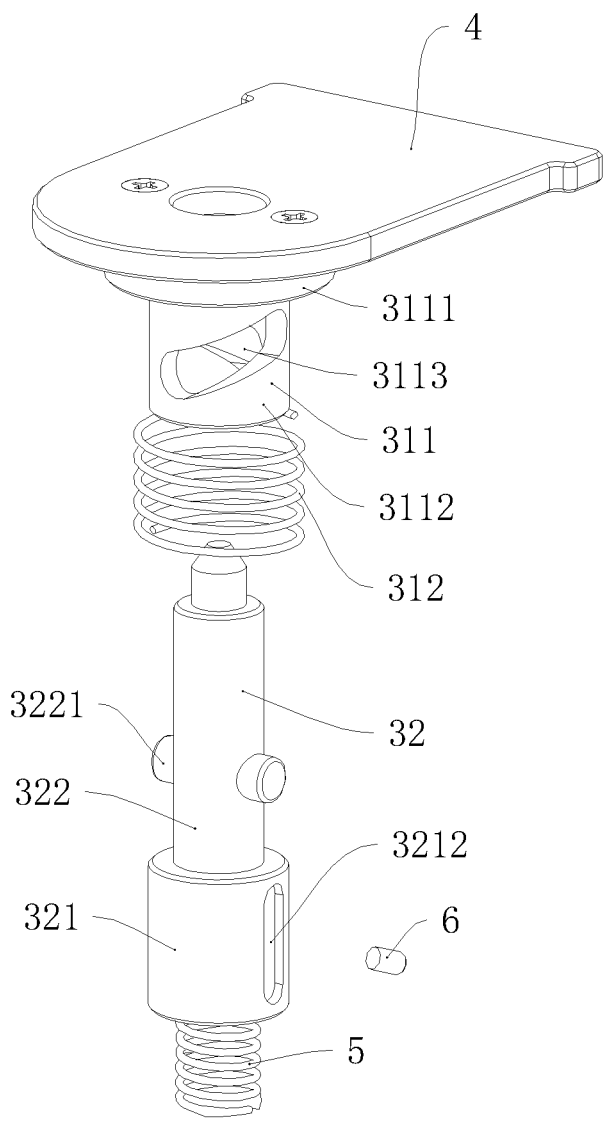
FIG. 6 is an exploded view of part of the structure shown in FIG. 4.
Figure 7:
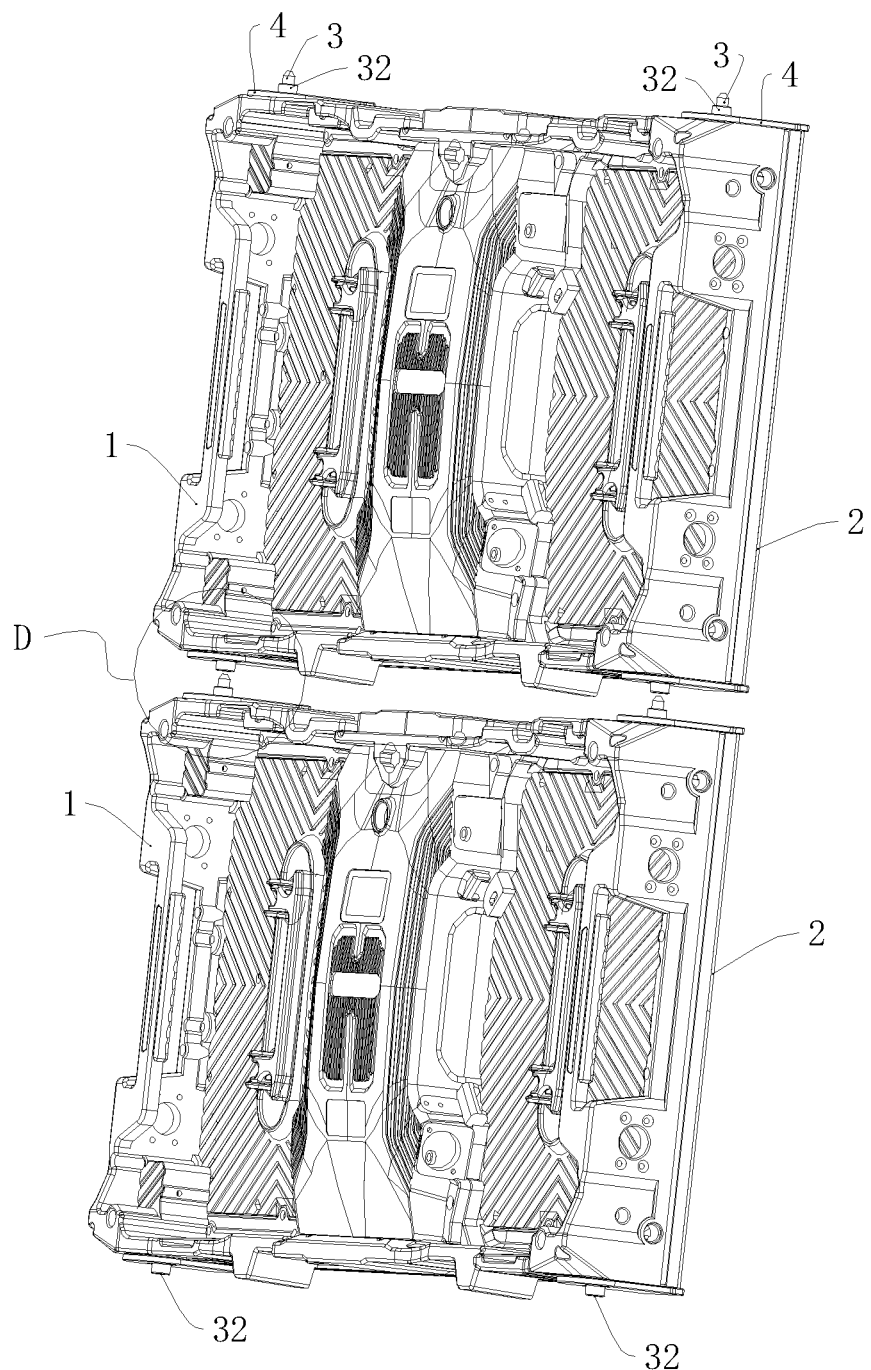
FIG. 7 is a schematic diagram I of splicing two adjacent anti-collision devices for LED screen shown in FIG. 1.
Figure 8:
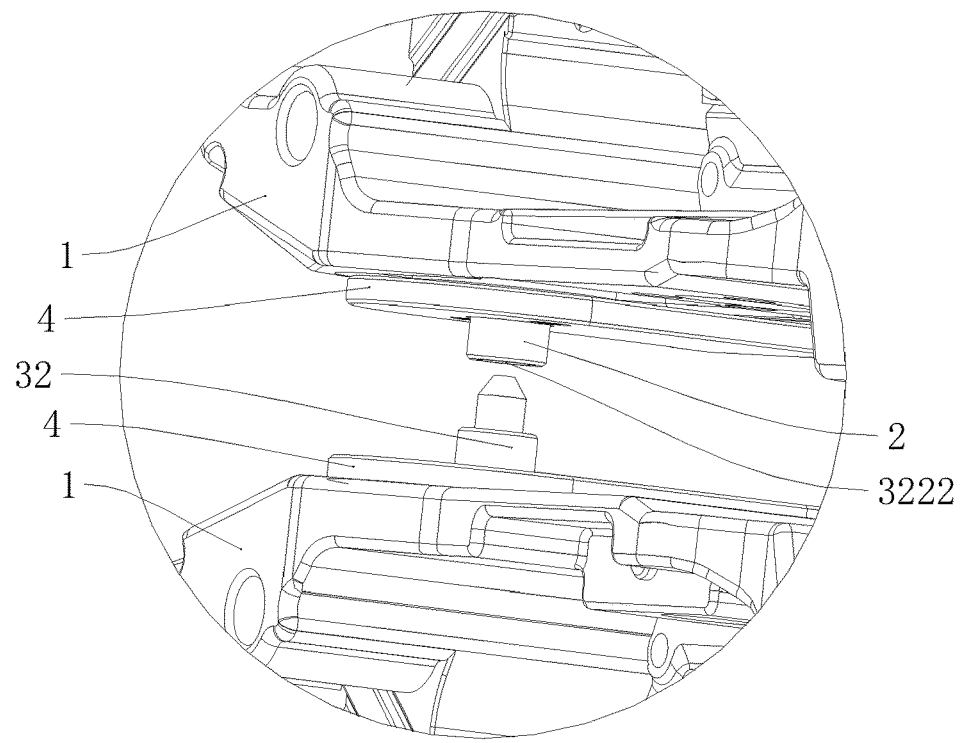
FIG. 8 is an enlarged view of D shown in FIG. 7.
Figure 9:
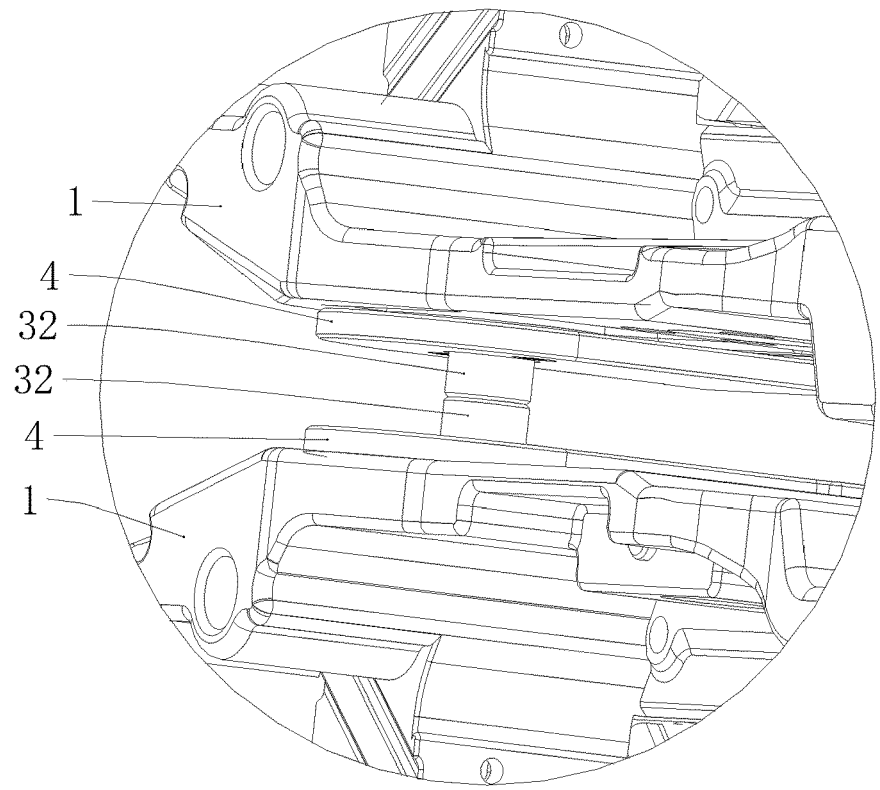
FIG. 9 is a schematic diagram II of splicing two adjacent anti-collision devices for LED screen shown in FIG. 8.
Figure 10:
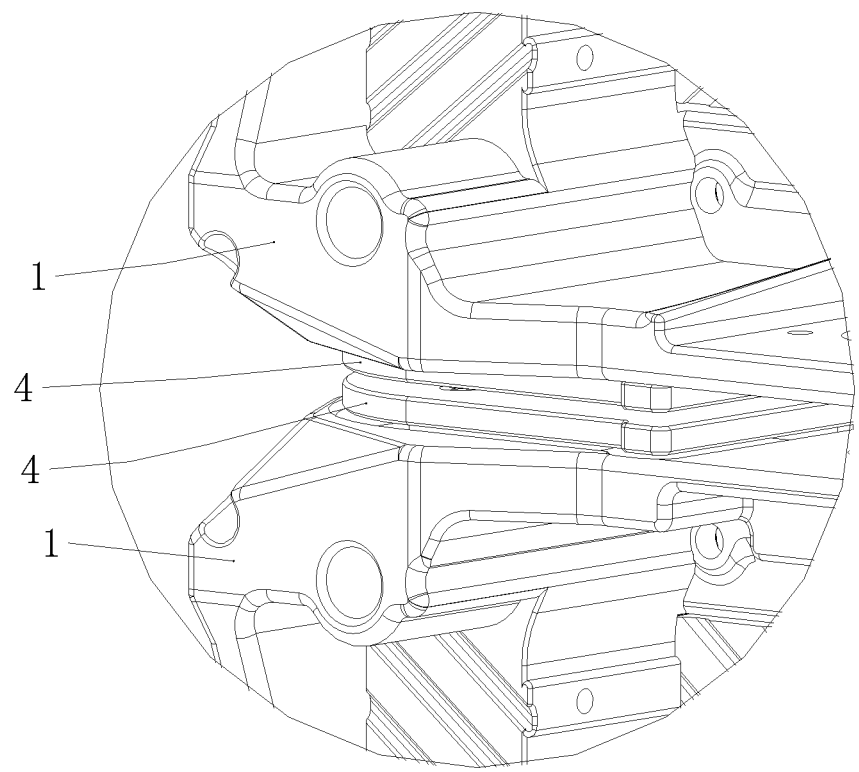
FIG. 10 is a schematic diagram III of splicing two adjacent anti-collision devices for LED screen shown in FIG. 8.
Figure 11:
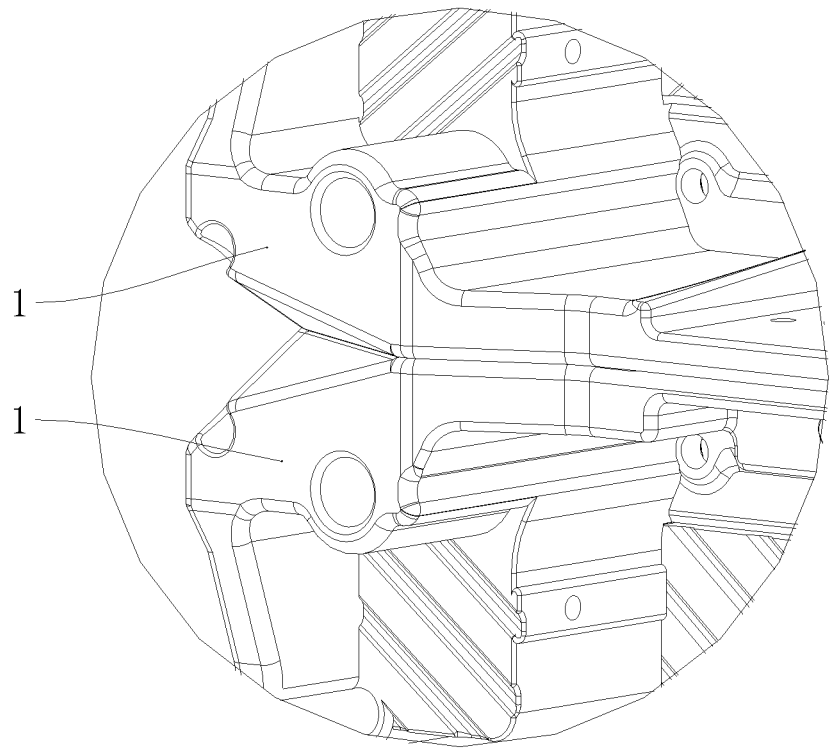
FIG. 11 is a schematic diagram IV of splicing two adjacent anti-collision devices for LED screen shown in FIG. 8.

In an embodiment, referring to FIGS. 4 and 6, the elastic mechanism 31 includes a guide shaft slidably disposed in the mounting hole 12 and a first elastic component 312 embedded in the mounting hole 12, and the anti-collision sheet 4 is fixedly connected with the guide shaft. In this way, the anti-collision sheet 4 has the same motion state as the guide shaft, and is slidably arranged in the mounting hole 12 through the guide shaft, so that the hole wall of the mounting hole 12 plays a guiding role in the motion of the guide shaft, thus ensuring that the anti-collision sheet 4 can smoothly extend out of or retract into the receiving groove 11, avoiding the anti-collision sheet 4 from being skewed in the movement process and failing to protect the display module 2, or avoiding that the anti-collision sheet 4 cannot be embedded in the receiving groove 11;

two ends of the first elastic component 312 respectively abut against the guide shaft and the hole wall of the mounting hole 12, so as to drive the guide shaft to slide by utilizing the elasticity of the first elastic component 312, thus simplifying the structure.

In an embodiment, referring to FIGS. 4 and 6, the guide shaft is a shaft sleeve 311. The telescopic rotating mechanism 3 further includes a positioning shaft 32, the positioning shaft 32 is embedded in the shaft sleeve 311 and non-rotatably connected with the hole wall of the mounting hole 12 to ensure that the positioning shaft 32 is always located in the mounting hole 12 and avoid the positioning shaft 32 from being separated from the mounting hole 12.

In an embodiment, referring to FIGS. 4 and 6, a spirally-rising sliding groove 3113 with closed ends is arranged on the outer side of the positioning shaft 32 or the inner side of the shaft sleeve 311, and the outer side of the positioning shaft 32 or the inner side of the shaft sleeve 311 is correspondingly provided with a sliding block 3221;

the sliding block 3221 is slidably arranged in the sliding groove 3113, and the first elastic component 312 can drive the shaft sleeve 311 to move relative to the positioning shaft 32. In this way, the sliding block 3221 slides in the sliding groove 3113, and under the condition that the positioning shaft 32 does not rotate and the sliding groove 3113 spirals upward, the shaft sleeve 311 rotates relative to the positioning shaft 32, thereby driving the anti-collision sheet 4 to rotate through the shaft sleeve 311. Both ends of sliding groove 3113 are closed, which can ensure that the shaft sleeve 311 does not separate from the positioning shaft 32.

Figure 5:
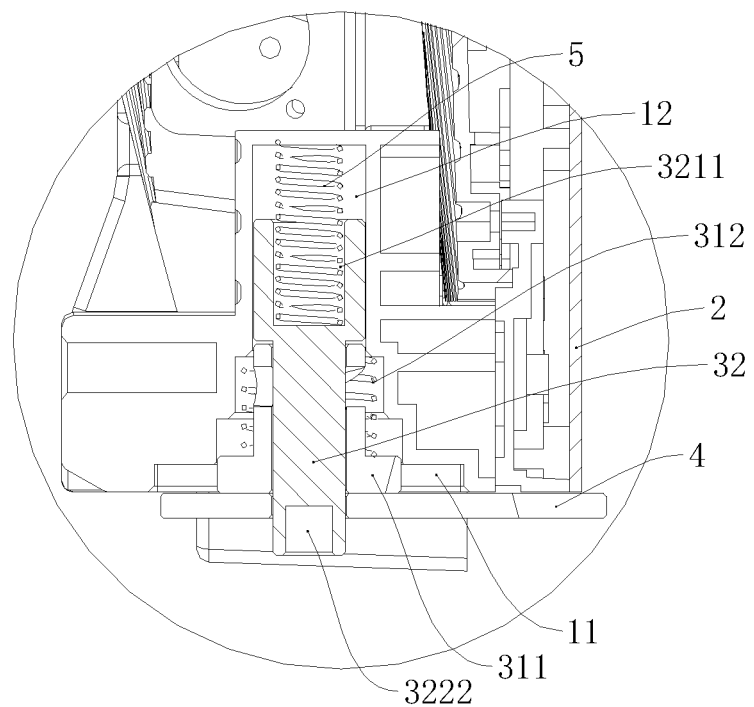
FIG. 5 is an enlarged view of C shown in FIG. 3.

In an embodiment, referring to FIGS. 4 to 6, it further includes a limit part 6 installed on the box body 1. The side face of the positioning shaft 32 is provided with a limit groove 3212, and the limit part 6 extends into the limit groove 3212, so that the positioning shaft 32 is limited in the mounting hole 12 by the limit part 6, and the positioning shaft 32 is restricted from rotating.

Specifically, the limit part 6 is a machine screw.

In an embodiment, referring to FIG. 4, FIG. 5 and FIG. 7 to FIG. 11, a plurality of telescopic rotating mechanisms 3 are provided and distributed on opposite sides of the box body 1, so as to protect different parts of the display module 2.

In an embodiment, referring to FIG. 4, FIG. 5 and FIG. 7 to FIG. 11, the telescopic rotating mechanism 3 is positioned at one side of the box body 1, an end of the positioning shaft 32 exposing the anti-collision sheet 4 is provided with a convex part; the telescopic rotating mechanism 3 is positioned at another side of the box body 1, an end of the positioning shaft 32 exposing the anti-collision sheet 4 is provided with a positioning hole 3222;

when adjacent box bodies 1 are spliced, the convex part of the positioning shaft 32 on one box body 1 extends into the positioning hole 3222 of the positioning shaft 32 on another box body 1, so as to quickly align the spliced two box bodies 1, thereby improving the splicing efficiency of adjacent box bodies 1. When positioning two box bodies 1, the positioning shaft 32 on one box body 1 can be abutted against the hole wall of the positioning hole 3222 on the positioning shaft 32 on the other box body 1 at first. Therefore, the positioning shaft 32 will be subjected to an external force in the direction of retracting the box body 1, so as to drive the anti-collision sheet 4 to retract and rotate to be embedded in the receiving groove 11, thus avoiding affecting the splicing of the two box bodies 1.

Figure 3:
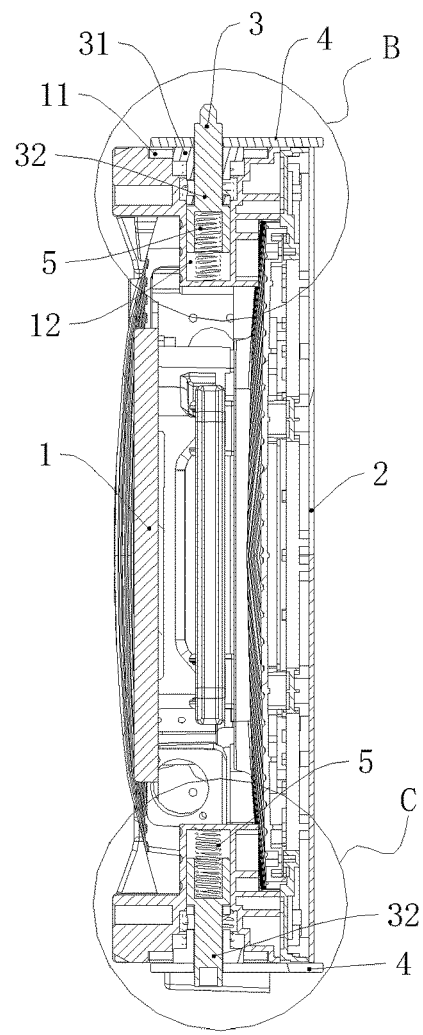
FIG. 3 is a cross-section view seen in direction A-A of FIG. 2.

In an embodiment, referring to FIGS. 3 to 5, the anti-collision device for LED screen further includes a second elastic component 5 arranged in the mounting hole 12, the limit groove 3212 extends along axial direction of the positioning shaft 32; so that the limit part 6 can slide in the limit groove 3212, thereby the positioning shaft 32 can move along the axial direction of the positioning shaft 32 in the mounting hole 12.

Both ends of the second elastic component 5 are respectively abutted against the positioning shaft 32 and the hole wall the mounting hole 12. In this way, the second elastic component 5 directly drives the positioning shaft 32 to slide in the mounting hole 12 along the axial direction of the positioning shaft 32, thus providing an active space for the telescopic rotating mechanism 3 to position the adjacent box body 1. It is convenient to position and splice the two box bodies 1, and avoid the gap between the two assembled box bodies 1 being too large due to the positioning shaft 32 being too long.

Particularly, the first elastic component 312 and the second elastic component 5 are springs.

In an embodiment, referring to FIGS. 4 and 5, a guide hole 3211 is arranged on the positioning shaft 32, and one end of the second elastic component 5 is arranged in the guide hole 3211 so as to limit the second elastic component 5 through the hole wall of the guide hole 3211, accordingly to guide the movement of the second elastic component 5, so as to prevent the second elastic component 5 from being skewed and affecting the extension and retraction movement of the positioning shaft 32 in the mounting hole 12.

In an embodiment, referring to FIGS. 4 to 6, the positioning shaft 32 has a first large-diameter section 321 and a first small-diameter section 322;

The shaft sleeve 311 abuts against the end wall of the first large-diameter section 321 near the first small-diameter section 322, so as to drive the positioning shaft 32 to extend along the mounting hole 12 through the second elastic component 5, so the end wall of the first large-diameter section 321 near the first small-diameter section 322 drives the shaft sleeve 311 to move along the extension direction of the mounting hole 12. At the same time, the first elastic component 312 will also drive the shaft sleeve 311 to move along the extension direction of the mounting hole 12, thus providing greater force for the anti-collision sheet 4 to extend out of the receiving groove 11.

Particularly, the guide hole 3211 is arranged on the first large-diameter section 321.

Particularly, the limit groove 3212 is arranged on the first large-diameter section 321.

In an embodiment, referring to FIGS. 4 to 6, the shaft sleeve 311 has a second large-diameter section 3111 and a second small-diameter section 3112.

The external diameter of the second small-diameter section 3112 is the same as that of the first large-diameter section 321, so as to arrange the mounting hole 12 and avoid the external diameter of the second small-diameter section 3112 being too large, which would increase the processing cost of the mounting hole 12.

The first elastic component 312 is sleeved in the second small-diameter section 3112. Therefore, the first elastic component 312 abuts against the end wall of the second large-diameter section 3111 near the second small-diameter section 3112, and the stability of the first elastic component 312 is improved. It also avoids increasing the distance between the first elastic component 312 and the second small-diameter section 3112 because the outer diameter of the second small-diameter section 3112 is too small.

In an embodiment, referring to FIGS. 4 to 6, the anti-collision sheet 4 is fixed on the end face of the second large-diameter section 3111 away from the second small-diameter section 3112. In this way, the contact area between the anti-collision sheet 4 and the shaft sleeve 311 is increased, so that the anti-collision sheet 4 can be conveniently fixed on the shaft sleeve 311.

Particularly, the anti-collision sheet 4 is fixed to the end face of the second large-diameter section 3111 by screws.

Particularly, the sliding groove 3113 is positioned at the second large-diameter section 3111, and the sliding block 3221 is positioned at the first small-diameter section 322.

The above description is only specific embodiments of the disclosure, not intended to limit the present disclosure. Any modifications, equivalent substitutions and improvements made in accordance with the principles of the present disclosure shall be understood as falling within the protection scope of the present disclosure.

What is claimed is:

1. An anti-collision device for LED screen, comprising a box body and a display module arranged on the box body, wherein, the device further comprises a telescopic rotating mechanism and an anti-collision sheet;
   a peripheral side of the box body is provided with a mounting hole and a receiving groove for receiving the anti-collision sheet;
   the telescopic rotating mechanism is embedded in the mounting hole and movably connected with the box body;
   the anti-collision sheet is fixedly connected with the telescopic rotating mechanism;
   when the telescopic rotating mechanism is not subjected to external force in its direction of extension and retraction, the telescopic rotating mechanism automatically enables the anti-collision sheet to shield a peripheral side of the display module outside the receiving groove;
   when the telescopic rotating mechanism is subjected to external force in its direction of retracting the box body, the telescopic rotating mechanism automatically drives the anti-collision sheet positioned outside the receiving groove to retract and rotate to be embedded in the receiving groove;
   the telescopic rotating mechanism comprises an elastic mechanism embedded in the mounting hole, and the anti-collision sheet is fixed on the elastic mechanism; and
   the elastic mechanism can drive the anti-collision sheet to extend out of or retract into the receiving groove.

2. The anti-collision device for LED screen of claim 1, wherein the elastic mechanism comprises a guide shaft slidably arranged in the mounting hole and a first elastic component embedded in the mounting hole, and the anti-collision sheet is fixedly connected with the guide shaft; and
   two ends of the first elastic component are respectively abutted with the guide shaft and a hole wall of the mounting hole.

3. The anti-collision device for LED screen of claim 2, wherein the guide shaft is a shaft sleeve; the telescopic rotating mechanism further comprises a positioning shaft, the positioning shaft is embedded in the shaft sleeve and is non-rotatably connected with the hole wall of the mounting hole.

4. The anti-collision device for LED screen of claim 3, wherein an outer side of the positioning shaft or an inner side of the shaft sleeve is provided with a spirally-rising sliding groove with closed ends, and the outer side of the positioning shaft or the inner side of the shaft sleeve is correspondingly provided with a sliding block; and
   the sliding block is slidably arranged in the sliding groove, and the first elastic component can drive the shaft sleeve to move relative to the positioning shaft.

5. The anti-collision device for LED screen of claim 4, further comprising a limit part installed on the box body; and
   a side face of the positioning shaft is provided with a limit groove, and the limit part extends into the limit groove.

6. The anti-collision device for LED screen of claim 5, wherein a plurality of the telescopic rotating mechanisms are provided, and distributed on opposite sides of the box body.

7. The anti-collision device for LED screen of claim 6, wherein the telescopic rotating mechanism is positioned at one side of the box body, an end of the positioning shaft exposing the anti-collision sheet is provided with a convex part; the telescopic rotating mechanism is positioned at another side of the box body, an end of the positioning shaft exposing the anti-collision sheet is provided with a positioning hole; and
   when adjacent box bodies are spliced, the convex part of the positioning shaft on one box body extends into the positioning hole of the positioning shaft on another box body.

8. The anti-collision device for LED screen of claim 7, further comprising a second elastic component arranged in the mounting hole, wherein the limit groove extends along axial direction of the positioning shaft;
   two ends of the second elastic component are respectively abutted against the positioning shaft and a hole wall the mounting hole.

9. The anti-collision device for LED screen of claim 8, wherein the positioning shaft is provided with a guide hole, and one end of the second elastic component is arranged in the guide hole.

10. The anti-collision device for LED screen of claim 9, wherein the positioning shaft has a first large-diameter section and a first small-diameter section; and
    the shaft sleeve abuts against an end wall of the first large-diameter section near the first small-diameter section.

11. The anti-collision device for LED screen of claim 10, wherein the guide hole is arranged on the first large-diameter section.

12. The anti-collision device for LED screen of claim 10, wherein the limit groove is arranged on the first large-diameter section.

13. The anti-collision device for LED screen of claim 10, wherein the shaft sleeve has a second large-diameter section and a second small-diameter section;
    outer diameter of the second small-diameter section is the same as that of the first large-diameter section; and
    the first elastic component is sleeved on the second small-diameter section.

14. The anti-collision device for LED screen of claim 13, wherein the anti-collision sheet is fixedly arranged on an end face of the second large-diameter section away from the second small-diameter section.

* * * * *